(12) United States Patent
Baek et al.

(10) Patent No.: US 11,982,943 B2
(45) Date of Patent: May 14, 2024

(54) METHOD OF FORMING PATTERNS USING RESIST UNDERLAYER COMPOSITION

(71) Applicant: SAMSUNG SDI CO., LTD., Yongin-si (KR)

(72) Inventors: Jaeyeol Baek, Suwon-si (KR); Shinhyo Bae, Suwon-si (KR); Yoojeong Choi, Suwon-si (KR); Soonhyung Kwon, Suwon-si (KR); Hyeon Park, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 195 days.

(21) Appl. No.: 17/732,807

(22) Filed: Apr. 29, 2022

(65) Prior Publication Data

US 2022/0260914 A1    Aug. 18, 2022

Related U.S. Application Data

(62) Division of application No. 16/558,486, filed on Sep. 3, 2019, now Pat. No. 11,385,545.

(30) Foreign Application Priority Data

Sep. 6, 2018   (KR) ........................ 10-2018-0106678

(51) Int. Cl.
*G03F 7/11*   (2006.01)
*G03F 7/004*  (2006.01)
(Continued)

(52) U.S. Cl.
CPC .......... *G03F 7/0955* (2013.01); *G03F 7/0045* (2013.01); *G03F 7/0392* (2013.01); *G03F 7/066* (2013.01); *G03F 7/094* (2013.01)

(58) Field of Classification Search
CPC .... G03F 7/0955; G03F 7/0045; G03F 7/0392; G03F 7/066; G03F 7/094
See application file for complete search history.

(56) References Cited

U.S. PATENT DOCUMENTS 3,676,440 A * 7/1972 Los ........................ C08K 5/37
544/221
2010/0009293 A1 * 1/2010 Yao ........................ G03F 7/091
528/69
(Continued)

FOREIGN PATENT DOCUMENTS

CN      103186043 A    7/2013
CN      105646850 A    6/2016
(Continued)

OTHER PUBLICATIONS

Pfeiffer, et al. "Physical Vapor Deposition, etc . . . " Advanced Functional Materials, 2007, 17, 2336-2342.

(Continued)

*Primary Examiner* — Mark F. Huff
*Assistant Examiner* — Richard David Champion
(74) *Attorney, Agent, or Firm* — Lee IP Law, P.C.

(57) ABSTRACT

A resist underlayer composition and a method of forming patterns, the composition including a polymer including at least one of a first moiety represented by Chemical Formula 1-1 and a second moiety represented by Chemical Formula 1-2; a thermal acid generator including a salt composed of an anion of an acid and a cation of a base, the base having pKa of greater than or equal to about 7; and a solvent, (Continued)

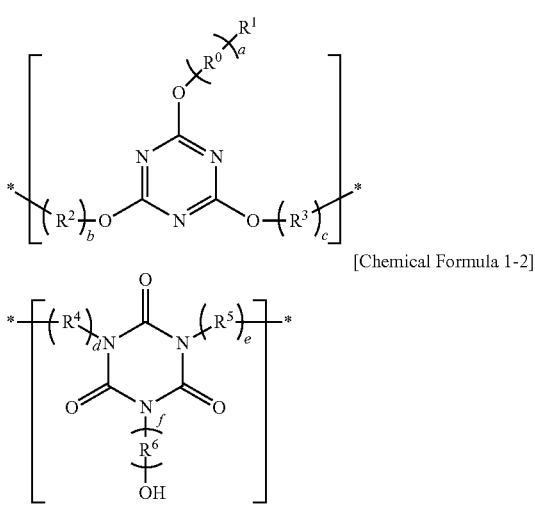

[Chemical Formula 1-1]

[Chemical Formula 1-2]

15 Claims, 5 Drawing Sheets

(51) Int. Cl.
  *G03F 7/039* (2006.01)
  *G03F 7/06* (2006.01)
  *G03F 7/09* (2006.01)
  *G03F 7/095* (2006.01)

(56) References Cited

U.S. PATENT DOCUMENTS

| | | | |
|---|---|---|---|
| 2010/0009297 A1* | 1/2010 | Yao | G03F 7/091 |
| | | | 528/425 |
| 2011/0104613 A1 | 5/2011 | Yao et al. | |
| 2017/0038687 A1 | 2/2017 | Ogata et al. | |
| 2017/0199459 A1 | 7/2017 | Ryu et al. | |

FOREIGN PATENT DOCUMENTS

| | | |
|---|---|---|
| CN | 106046696 A | 10/2016 |
| CN | 108388079 A | 8/2018 |
| EP | 2602660 A | 6/2013 |
| JP | 58-190946 A | 11/1983 |
| JP | 2002-012761 A | 1/2002 |
| JP | 2006-341590 A | 12/2006 |
| JP | 2007-017970 A | 1/2007 |
| JP | 2011-527461 A | 10/2011 |
| JP | 2013-073061 A | 4/2013 |
| JP | 2013-092706 A | 5/2013 |
| JP | 2013-122570 A | 6/2013 |
| JP | 2015-129937 A | 7/2015 |
| JP | 2017-107185 A | 6/2017 |
| JP | 2018-124546 A | 8/2018 |
| JP | 2019-008281 A | 1/2019 |
| KR | 10-0934436 B1 | 12/2009 |
| KR | 10-1236560 B1 | 2/2013 |
| KR | 10-1304770 B1 | 8/2013 |
| KR | 10-2014-0056089 A | 5/2014 |
| KR | 10-2014-0085123 A | 7/2014 |
| KR | 10-1532103 B1 | 6/2015 |
| KR | 10-1536798 B1 | 7/2015 |
| KR | 10-1566532 B1 | 10/2015 |
| KR | 10-1652148 B1 | 8/2016 |
| KR | 10-2017-0084820 A | 7/2017 |
| KR | 10-2017-0132082 A | 12/2017 |
| KR | 10-2018-0090640 A | 8/2018 |
| KR | 10-2018-0121205 A | 11/2018 |
| TW | 201219986 A | 5/2012 |
| TW | 201239047 A | 10/2012 |
| TW | 201500858 A | 1/2015 |
| WO | WO 2007/148627 A1 | 12/2007 |
| WO | WO 2008/017954 A2 | 2/2008 |

OTHER PUBLICATIONS

Zhang et al. Research Progress and Application Status of Poly (phthalaldehyde), China Academic Journal, vol. 45, No. 14, Jul. 2017.
Chinese Search Report dated Dec. 16, 2022.
English Translation—JP 58-190946 A; Wahei Nishizawa, Published: Nov. 8, 1983.
English Translation—JP 2002-012761 A; Ryoji Okuda, Published: Jan. 15, 2002.
Japanese Office Action dated Oct. 27, 2020.
Korean Office Action dated Dec. 1, 2020.
Taiwanese Office Action and Search Report dated Jun. 10, 2020.

* cited by examiner

METHOD OF FORMING PATTERNS USING RESIST UNDERLAYER COMPOSITION

CROSS-REFERENCE TO RELATED APPLICATIONS

This is a divisional application based on pending application Ser. No. 16/558,486, filed Sep. 3, 2019, the entire contents of which is hereby incorporated by reference.

Korean Patent Application No. 10-2018-0106678, filed on Sep. 6, 2018, in the Korean Intellectual Property Office, and entitled: "Resist Underlayer Composition, and Method of Forming Patterns Using the Composition," is incorporated by reference herein in its entirety.

BACKGROUND

1. Field

Embodiments relate to a resist underlayer composition and a method of forming patterns using the same.

2. Description of the Related Art

The semiconductor industry has developed to an ultra-fine technique having a pattern of several to several tens of nanometer size. Such ultrafine technique uses effective lithographic techniques.

The lithographic technique may include coating a photoresist layer on a semiconductor substrate such as a silicon wafer, exposing and developing it to form a thin layer, irradiating activated radiation such as ultraviolet (UV) while disposing a mask pattern having a pattern of a device, developing the resultant to obtain a photoresist pattern, etching the substrate using the photoresist pattern as a protective layer to form a fine pattern corresponding to the pattern on the surface of the substrate.

SUMMARY

The embodiments may be realized by providing a resist underlayer composition including a polymer including at least one of a first moiety represented by Chemical Formula 1-1 and a second moiety represented by Chemical Formula 1-2; a thermal acid generator including a salt composed of an anion of an acid and a cation of a base, the base having pKa of greater than or equal to about 7; and a solvent,

[Chemical Formula 1-1]

[Chemical Formula 1-2]

wherein, in Chemical Formula 1-1 and Chemical Formula 1-2, a and f are each independently an integer of 0 to 3, when a is 0, $R^1$ is hydrogen, a C1 to C30 alkyl group substituted with at least one hydroxy group, or a C1 to C30 heteroalkyl group substituted with at least one hydroxy group, when a is an integer of 1 to 3, $R^1$ is a hydroxy group and $R^0$ is a substituted or unsubstituted C1 to C30 alkylene group, a substituted or unsubstituted C6 to C30 arylene group, a substituted or unsubstituted C1 to C30 heteroalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, —(C=O)—O—, —O—, —S—, or a combination thereof, $R^2$ to $R^6$ are each independently a substituted or unsubstituted C1 to C30 alkylene group, a substituted or unsubstituted C6 to C30 arylene group, a substituted or unsubstituted C1 to C30 heteroalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, —(C=O)—O—, —O—, —S—, or a combination thereof, b, c, d, and e are each independently an integer of 0 to 3, and * is a linking point.

The anion may be a non-aromatic anion.

The anion may be represented by Chemical Formula 2:

[Chemical Formula 2]

wherein, in Chemical Formula 2, $R^{11}$ to $R^{15}$ may be each independently hydrogen, deuterium, a halogen, a substituted or unsubstituted C1 to C30 alkyl group, or a substituted or unsubstituted C1 to C30 heteroalkyl group, provided at least one of $R^{11}$ to $R^{13}$ is a halogen, and n may be an integer of 0 to 10.

In Chemical Formula 2, at least one of $R^{11}$ to $R^{15}$ may be fluorine.

The cation may be represented by Chemical Formula 3:

[Chemical Formula 3]

wherein, in Chemical Formula 3, $R^{21}$ to $R^{24}$ may be each independently hydrogen, deuterium, a substituted or unsubstituted C1 to C30 alkyl group, or a substituted or unsubstituted C1 to C30 heteroalkyl group.

The thermal acid generator may be included in an amount of about 0.01 wt % to about 10 wt %, based on 100 wt % of the composition.

The polymer may include the first moiety represented by Chemical Formula 1-1, and in Chemical Formula 1-1, $R^2$ and $R^3$ may be each independently —(C=O)—O—, —O—, —S—, a substituted or unsubstituted C1 to C30 alkylene group, or a substituted or unsubstituted C1 to C30 heteroalkylene group.

The polymer may include the first moiety represented by Chemical Formula 1-1, and in Chemical Formula 1-1, a may be 1, $R^0$ may be —(C=O)—O—, —O—, —S—, a substituted or unsubstituted C1 to C30 alkylene group, or a substituted or unsubstituted C1 to C30 heteroalkylene group.

The polymer may have a weight average molecular weight of about 1,000 to about 100,000.

The polymer may be included in an amount of about 0.1 wt % to about 40 wt %, based on 100 wt % of the composition.

The resist underlayer composition may further include a cross-linking agent having two or more cross-linking sites.

The resist underlayer composition may further include a surfactant, an absorber, a plasticizer, or a combination thereof.

The embodiments may be realized by providing a method of forming patterns, the method including forming an etching subject layer on a substrate, coating the resist underlayer composition according to an embodiment on the etching subject layer to form a resist underlayer, forming a photoresist pattern on the resist underlayer, and sequentially etching the resist underlayer and the etching subject layer using the photoresist pattern as an etching mask.

Forming the photoresist pattern may include forming a photoresist layer on the resist underlayer, exposing the photoresist layer, and developing the photoresist layer.

Forming the resist underlayer may further include heat-treating the coated resist underlayer composition at a temperature of about 100° C. to about 500° C.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements throughout.

In the drawings, the thickness of layers, films, panels, regions, etc., are exaggerated for clarity and like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "substituted" refers to replacement of a hydrogen atom of a compound by a substituent selected from a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term "hetero" refers to one including 1 to 10 heteroatoms selected from N, O, S, and P.

As used herein, when a definition is not otherwise provided, "*" refers to a linking point of a compound or a compound moiety. As used herein, the term "or" is not an exclusive term, e.g., "A or B" includes A, B, or A and B.

Hereinafter, a resist underlayer composition according to an embodiment is described.

A resist underlayer composition according to an embodiment may include, a thermal acid generator, and a solvent. The polymer may include, e.g., a first moiety represented by Chemical Formula 1-1 or a second moiety represented by Chemical Formula 1-2 (e.g., at least one of the first moiety and the second moiety). The thermal acid generator may include a salt composed of an acid-derived anion (e.g., an anion of an acid) and a cation derived from a base (e.g., a cation of a base) having pKa of greater than or equal to about 7.

[Chemical Formula 1-1]

[Chemical Formula 1-2]

In Chemical Formula 1-1 to Chemical Formula 1-2,
a and f may each independently be, e.g., an integer of 0 to 3.

In an implementation, when a is 0, $R^1$ may be, e.g., hydrogen, a C1 to C30 alkyl group substituted with at least one hydroxy group, or a C1 to C30 heteroalkyl group substituted with at least one hydroxy group, In an implementation, when a is an integer of 1 to 3, $R^1$ may be, e.g., a hydroxy group, and $R^0$ may be or may include, e.g., a substituted or unsubstituted C1 to C30 alkylene group, a substituted or unsubstituted C6 to C30 arylene group, a substituted or unsubstituted C1 to C30 heteroalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, —(C=O)—O— (e.g., an ester:

),

—O— (e.g., an ether), —S— (e.g., a thioether), or a combination thereof.

$R^2$ to $R^6$ may each independently be or include, e.g., a substituted or unsubstituted C1 to C30 alkylene group, a substituted or unsubstituted C6 to C30 arylene group, a substituted or unsubstituted C1 to C30 heteroalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, —(C=O)—O—, —O—, —S—, or a combination thereof.

b, c, d, and e may each independently be, e.g., an integer of 0 to 3.

* is a linking point.

The first and second moieties represented by Chemical Formula 1-1 and Chemical Formula 1-2 have a structure in which a triazine backbone is present in the core and three oxygen atoms are linked with the triazine. Due to such a structure, a relatively high refractive index (n) and a low extinction coefficient (k) for activated radiation may be obtained. In an implementation, when the composition including the polymer is used, e.g., as a photoresist underlayer material, the composition may have an optimized reflectance from an etched layer with respect to a light source and thus may suppress a light interference effect and in addition, may have high etch selectivity with a photoresist layer during the etching process and excellent flatness.

The first and second moieties represented by Chemical Formula 1-1 and Chemical Formula 1-2 may each independently include at least one hydroxy group and may further secure uniformity of the coating by having such a structure.

In an implementation, in Chemical Formula 1-1, when a is 0, $R^1$ may be, e.g., hydrogen, a C1 to C30 alkyl group substituted with at least one hydroxy group, or a C1 to C30 heteroalkyl group substituted with at least one hydroxy group.

In an implementation, in Chemical Formula 1-1, when a is 1, $R^0$ may include, e.g., —(C=O)—O—, —O—, —S—, a substituted or unsubstituted C1 to C30 alkylene group (e.g., a C1 to C30 alkylene group substituted with at least one hydroxy group), or a substituted or unsubstituted C1 to C30 heteroalkylene group.

In an implementation, in Chemical Formula 1-1, $R^2$ and $R^3$ may each independently include, e.g., —(C=O)—O—, —O—, or —S—.

The polymer may be stable in an organic solvent and heat, and when a resist underlayer composition including the polymer is, e.g., used as a photoresist underlayer material, a resist underlayer formed thereof may be minimized from delamination by the solvent or the heat during a process of forming a photoresist pattern or minimize generation of a byproduct such as a chemical material and the like and a thickness loss by a photoresist solvent thereon. In addition, the compound has excellent solubility to provide a resist underlayer having improved coating uniformity.

In an implementation, the polymer may be a copolymer including at least one moiety or repeating unit of other monomers (e.g., a moiety or repeating unit different from the first and second moieties of Chemical Formula 1-1 and Chemical Formula 1-2.

The polymer may have a weight average molecular weight of, e.g., about 1,000 to about 100,000. In an implementation, the polymer may have, e.g., a weight average molecular weight of about 1,000 to about 50,000 or about 1,000 to about 20,000. When the polymer has a weight average molecular weight within the ranges, the amount of carbon and solubility for a solvent of the resist underlayer composition including the polymer may be optimized.

When the polymer is used as a material for a resist underlayer, a uniform thin layer may not only be obtained without forming a pin-hole or a void and deteriorating a thickness distribution during a baking process, but improved gap-fill and planarization characteristics may also be obtained when a lower substrate (or a layer) has a step or is patterned.

The polymer may be included in the composition in an amount of, e.g., greater than or equal to about 0.1 wt % or greater than or equal to about 0.5 wt %, and less than or equal to about 40 wt %, less than or equal to about 30 wt %, or less than or equal to about 20 wt %, e.g., about 0.1 wt % to about 40 wt % or about 0.5 wt % to about 30 wt %, based on a total weight (100 wt %) of the composition. When the polymer is included within the ranges, a thickness, a surface roughness, and a planarization degree of the formed resist underlayer may be controlled.

In an implementation, the thermal acid generator may include a salt composed of an acid-derived anion and a base-derived cation. In an implementation, the thermal acid generator may be composed of the salt. In an implementation, the anion of the salt may be an anion of a base having a pKa of greater than or equal to about 7.

In an implementation, the anion may be a non-aromatic anion. For example, the anion may have no aromaticity, and it may have an effect of improving solubility and controlling pKa. The anion may be, e.g., an anion represented by Chemical Formula 2.

[Chemical Formula 2]

In Chemical Formula 2, $R^{11}$ to $R^{15}$ may each independently be or include, e.g., hydrogen, deuterium, a halogen, a substituted or unsubstituted C1 to C30 alkyl group, or a substituted or unsubstituted C1 to C30 heteroalkyl group. In an implementation, at least one of $R^{11}$ to $R^{13}$ may be a halogen.

n may be, e.g., an integer of 0 to 10.

In an implementation, the anion may include at least one fluorine group (—F). For example, in Chemical Formula 2, at least one of $R^{11}$ to $R^{15}$ may be a fluorine group (—F).

In an implementation, the cation may be non-aromatic like the aforementioned anion.

In an implementation, the cation may be, e.g., represented by Chemical Formula 3.

[Chemical Formula 3]

In Chemical Formula 3, $R^{21}$ to $R^{24}$ may each independently be or include, e.g., hydrogen, deuterium, a substituted or unsubstituted C1 to C30 alkyl group, or a substituted or unsubstituted C1 to C30 heteroalkyl group.

A resist according to an embodiment may have an appropriate refractive index (n) and an extinction coefficient (k) sufficient to minimize a phenomenon such as a diffused reflection of an exposure light ray to photoresist; to be coated in a uniform thickness during the coating; not to be mixed with the resist since the coated resist underlayer is dissolved in a solvent used for the coating of photoresist; and to ensure etching at a faster rate than the photoresist in a dry etching process for the photoresist.

The resist underlayer composition according to an embodiment may use the salt as a thermal acid generator, e.g., the salt may be formed using anion of a base having pKa of greater than or equal to about 7. For example, when the resist underlayer is formed using the resist underlayer composition according to an embodiment, the thermal acid generator may generate a cross-linking of the aforementioned polymer, so as to accelerate formation of a resist underlayer, and also to maintain excellent density and coating uniformity of the resist underlayer.

The thermal acid generator may also impart stability for an organic solvent in the resist underlayer compositions according to an embodiment. For example, the resist underlayer composition according to an embodiment may help minimize and/or prevent dissolution of the solvent used in photoresist coating in the formation of the pattern, while having improved storage stability.

In addition, when a resist underlayer is formed using the resist underlayer composition including the aforementioned polymer and thermal acid generator simultaneously, the resist underlayer may have an excellent refractive index (n) and a low extinction coefficient (k). For example, the resist underlayer may exhibit excellent chemical resistance even in a thin film state of less than or equal to about 300 Å. Using the resist underlayer, the photoresist pattern may effectively absorb reflected light and thus form a good pattern. For example, when the photoresist pattern is formed using the resist underlayer, high etch selectivity and excellent pattern formability may be ensured.

The thermal acid generator may be included in an amount of, e.g., greater than or equal to about 0.01 wt % or greater than or equal to about 0.02 wt %, and less than or equal to about 10 wt %, less than or equal to about 5 wt %, or less than or equal to about 1 wt %. In an implementation, the thermal acid generator may include included in an amount of, e.g., about 0.01 wt % to about 10 wt % or about 0.01 wt % to about 5 wt %, based on a total weight (100 wt %) of the composition. When the thermal acid generator is included within the ranges, formation of resist underlayer may be promoted by causing cross-linking to the polymer at a baking temperature during bake processes of the composition. The resist underlayer density and the coating uniformity of the formed resist underlayer are also improved.

The solvent may be a suitable solvent having sufficient solubility or dispersibility or the polymer. In an implementation, the solvent may include, e.g., propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, or ethyl 3-ethoxypropionate.

In an implementation, the resist underlayer composition may further include a cross-linking agent.

The cross-linking agent may include, e.g., a melamine cross-linking agent, a substituted urea cross-linking agent, or a polymer cross-linking agent. In an implementation, it may be a cross-linking agent having at least two cross-linking forming substituents, e.g., methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, butoxymethylated thiourea, or the like.

The cross-linking agent may be a cross-linking agent having high heat resistance and may be, e.g., a compound including a cross-linking substituent including an aromatic ring (for example a benzene ring, or a naphthalene ring) in the molecule. The cross-linking agent may have, e.g., two or more, three or more, or four or more cross-linking sites.

In an implementation, the resist underlayer composition may further include, e.g., at least one other polymer of an acryl resin, an epoxy resin, a novolac resin, a glycoluril resin, or a melamine resin, in addition to the compound including the structural unit or moiety represented by Chemical Formula 1.

In an implementation, the resist underlayer composition may further include an additive, e.g., a surfactant, an absorber, a plasticizer, or a combination thereof.

In an implementation, the surfactant may include, e.g., an alkylbenzene sulfonate salt, an alkyl pyridinium salt, polyethylene glycol, a quaternary ammonium salt, a fluoroalkyl-based compound, or the like.

In an implementation, the plasticizer may include a suitable plasticizer. Examples of a plasticizer may include low molecular compounds such as phthalic acid esters, adipic acid esters, phosphoric acid esters, trimellitic acid esters, citric acid esters, and the like, polyether compounds, polyester-based compounds, polyacetal compounds, and the like.

The additive may be included in an amount of, e.g., about 0.001 wt % to about 40 wt %, based on a total weight (100 wt %) of the resist underlayer composition. Within the ranges, solubility may be improved while optical properties of the resist underlayer composition are not changed.

According to another embodiment, a resist underlayer manufactured using the aforementioned resist underlayer composition may be provided. The resist underlayer may be obtained by coating the resist underlayer composition on, e.g., a substrate and then curing it through a heat treatment process. The resist underlayer may be, e.g., an organic thin layer used in electronic devices such as a planarization layer, an anti-reflection coating, a sacrificial layer, or a filler.

Hereinafter, a method of forming patterns using the resist underlayer composition is described referring to FIGS. 1 to 5.

FIGS. 1 to 5 illustrate cross-sectional views of stages in a method of forming patterns using a resist underlayer composition according to an embodiment.

Figure 1:
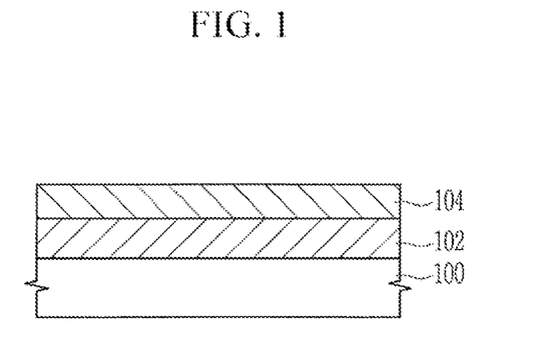
FIGS. 1 to 5 illustrate cross-sectional views of stages in a method of forming patterns using a resist underlayer composition according to an embodiment.

Referring to FIG. 1, a subject for etching may be prepared. The etching subject may be a thin layer 102 formed on a semiconductor substrate 100. Hereinafter, the etching subject is the thin layer 102. A surface of the thin layer 102 may be washed to remove impurities and the like remaining thereon. The thin layer 102 may be, e.g., a silicon nitride layer, a polysilicon layer, or a silicon oxide layer.

Subsequently, the resist underlayer composition according to an embodiment (e.g., including the polymer, the thermal acid generator, and the solvent) may be coated on the surface of the washed thin layer 102 by a spin coating method.

Then, the coated composition may be dried and baked to form a resist underlayer 104 on the thin layer 102. The baking may be performed at about 100° C. to about 500° C., e.g., about 100° C. to about 300° C. For example, the resist underlayer composition may be the same as described above.

Figure 2:
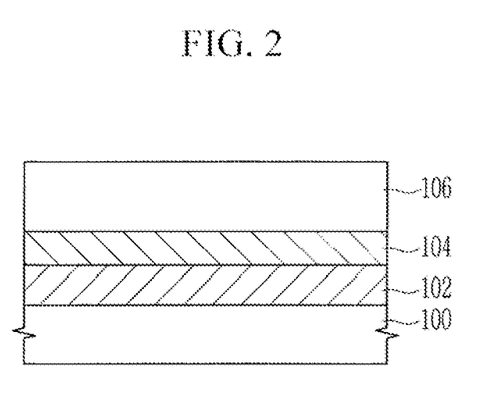

Referring to FIG. 2, a photoresist layer 106 may be formed by coating a photoresist on the resist underlayer 104.

Examples of the photoresist may include a positive-type photoresist containing a naphthoquinone diazide compound and a novolac resin, a chemically-amplified positive photoresist including an acid generator and an alkali-soluble resin having a group capable of endowing a resin increasing solubility in an alkali aqueous solution, and the like.

Subsequently, a substrate 100 having the photoresist layer 106 may be primarily baked. The primary baking may be performed at about 90° C. to about 120° C.

Figure 3:
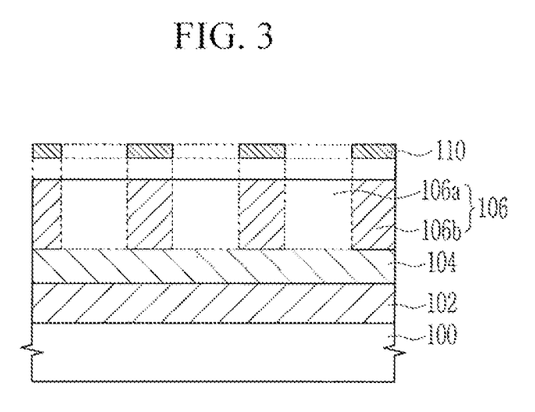

Referring to FIG. 3, the photoresist layer 106 may be selectively exposed.

Exposure of the photoresist layer 106 may be, e.g., performed by positioning an exposure mask having a predetermined pattern on a mask stage of an exposure apparatus and aligning the exposure mask 110 on the photoresist layer 106. Subsequently, a predetermined region of the photoresist layer 106 on the substrate 100 may selectively react with light passing the exposure mask by radiating light into the exposure mask 110. For example, examples of the light used during the exposure may be a KrF excimer laser (wavelength 248 nm), an ArF excimer laser (wavelength 193 nm), EUV (extreme ultraviolet) having a wavelength of 13.5 nm, and E-Beam.

An exposed region 106a of the photoresist layer 106 may be relatively hydrophilic or hydrophobic compared with a non-exposed region 106b of the photoresist layer 106. Accordingly, the exposed region 106a and non-exposed region 106b of the photoresist layer 106 may have a different solubility each other.

Subsequently, the substrate 100 may be secondarily baked. The secondary baking may be performed at about 90° C. to about 150° C. The non-exposed region 106b of the photoresist layer may become easily soluble with respect to a particular solvent due to the secondary baking.

Figure 4:
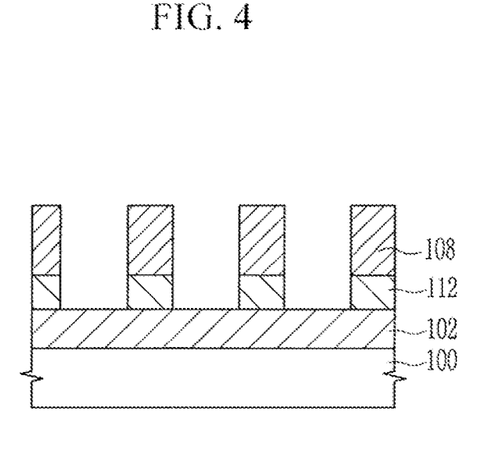

Referring to FIG. 4, the non-exposed region 106b of the photoresist layer may be dissolved and removed by a developing solution to form a photoresist pattern 108. For example, the non-exposed region 106b of the photoresist layer may be dissolved and removed by using a developing solution such as tetra-methyl ammonium hydroxide (TMAH) and the like to finish the photoresist pattern 108.

Subsequently, the photoresist pattern 108 may be used as an etching mask to etch the resist underlayer. Through the etching, an organic layer pattern 112 may be formed.

The etching may be, e.g., dry etching using etching gas, and the etching gas may be, e.g., $CHF_3$, $CF_4$, $Cl_2$, $BCl_3$, or a mixed gas thereof.

Figure 5:
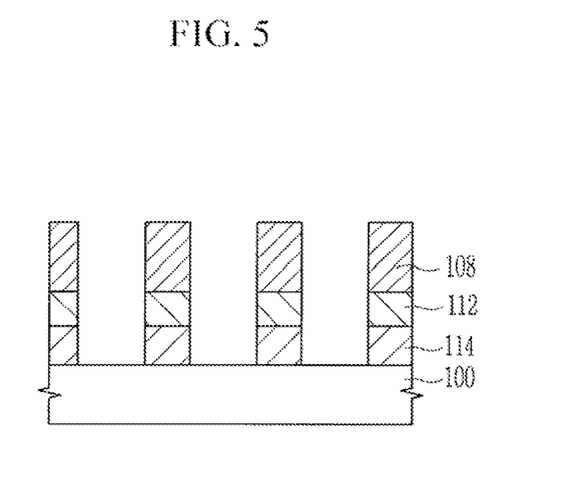

Referring to FIG. 5, the photoresist pattern 108 and the organic layer pattern 112 may be used as an etching mask to etch the exposed thin layer 102. As a result, the thin layer may be formed into a thin layer pattern 114.

Hereinafter, embodiments are described in more detail through examples regarding synthesis of the polymer and preparation of a resist underlayer composition including the same.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Polymer 1,3-Diallyl-5-(2-hydroxyethyl) isocyanurate (DAC-EC: 30 g, 1.0 equivalent), 1,2-ethanedithiol (EDT: 11.16 g, 1.0 equivalent), azobisisobutyronitrile (AIBN: 0.389 g, 0.02 equivalent), and dimethylformamide (DMF: 166 g, for a solid content of 20%) were added into a 500 ml two-necked round flask connected to a condenser. After increasing a temperature up to 80° C., a reaction was carried out with monitoring a molecular weight depending upon a time using GPC. Confirming that a weight average molecular weight at 2.5 hours was 3,098, a reaction solution was cooled to ambient temperature. After transporting the reaction solution to a 1 L wide mouth bottle, it was washed with 800 g of hexane three times, and subsequently washed using 500 g of diethylether and 600 g of tertiary distilled water. The obtained gum resin was completely dissolved using 80 g of THF and then slowly dropped into 700 g of toluene which being stirred. After discarding a solvent, the residual solvent remained in the resin was removed using a vacuum pump to provide 29 g (final weight average molecular weight of 5,130, yield of 60%) of a compound. The obtained compound was a polymer including a structural unit of Chemical Formula 1-A.

[Chemical Formula 1-A]

Types of Salts

Salt Example 1

A salt in which an anion represented by Chemical Formula 2-1 and a cation represented by Chemical Formula 3-1 formed an ionic bond and dissolved in water to have pKa=9.24, was purchased through Aldrich.

[Chemical Formula 2-1]

NH$_4^+$ [Chemical Formula 3-1]

Salt Example 2

A salt in which an anion represented by Chemical Formula 2-1 and a cation represented by Chemical Formula 3-2 formed an ionic bond and dissolved in water to have pKa=10.75, was purchased through Aldrich.

[Chemical Formula 2-1]

[Chemical Formula 3-2]

Salt Example 3

A salt in which an anion represented by Chemical Formula 2-1 and a cation represented by Chemical Formula 3-3 formed an ionic bond and dissolved in water having pKa=10.89, was purchased through Aldrich.

[Chemical Formula 2-1]

[Chemical Formula 3-3]

Salt Example 4

A salt in which an anion represented by Chemical Formula 2-2 and a cation represented by Chemical Formula 3-1 formed an ionic bond and dissolved in water to have pKa=9.24, was purchased through Aldrich.

[Chemical Formula 2-2]

NH$_4^+$ [Chemical Formula 3-1]

Comparative Salt Example 1

A salt in which an anion represented by Chemical Formula 4 and a cation represented by Chemical Formula 3-1 formed an ionic bond was obtained.

[Chemical Formula 4]

NH$_4^+$ [Chemical Formula 3-1]

Comparative Salt Example 2

A salt in which an anion represented by Chemical Formula 4 and a cation represented by Chemical Formula 5 formed an ionic bond and dissolved in water to have pKa=5.25, was purchased through Aldrich.

[Chemical Formula 4]

[Chemical Formula 5]

Comparative Salt Example 3

Without forming a salt, a compound (pKa=−2.8 when dissolved in water) represented by Chemical Formula 6 was used.

[Chemical Formula 6]

Preparation of Resist Underlayer Composition

Example 1

A polymer represented by Chemical Formula 1-1, PL1174 manufactured by TCI as a cross-linking agent (in an amount of 15 wt % based on total weight, 100 wt %, of the polymer) and the salt of Salt Example 1 (in an amount of 3 wt % based on total weight, 100 wt %, of the polymer) were dissolved in a mixed solvent (mixing weight ratio=1:1) of propylene glycol monomethylether and ethyl lactate, and then stirred for 6 hours to provide a resist underlayer composition.

An amount of the mixed solvent was adjusted to provide a solid content of the polymer at 1 wt %, based on a total weight (100 wt %) of the obtained resist underlayer composition.

Example 2 to Example 4

Each resist underlayer composition was prepared in accordance with the same procedure as in Example 1, except that each salt of Salt Examples 2 to 4 was used instead of the salt used in Example 1.

Comparative Example 1 to Comparative Example 3

Each resist underlayer composition was prepared in accordance with the same procedure as in Example 1, except that the salt or the composition of each of Comparative Salt Examples 1 to 3 was used instead of the salt used in Example 1.

Evaluation 1: Evaluation of Layer Density

The compositions of Examples 1 to 4 and Comparative Examples 1 to 3 were each taken in 2 mL samples, coated on a 4-inch wafer, and then a spin coating was performed at 1,500 rpm for 20 seconds using an auto track ACT8 (manufactured by TEL). Then it was cured at 210° C. for 90 seconds to provide a resist underlayer having a thickness of 30 nm. Each resist underlayer was performed with a measurement through a XRR method to measure a density of a resist underlayer based on a threshold angle. X'pert PRO MPD (manufactured by Panalytical) was used as a measuring equipment.

The results are shown in Table 1.

TABLE 1

| | Layer density (dyne/cm$^2$) |
|---|---|
| Example 1 | 1.31 |
| Example 2 | 1.31 |
| Example 3 | 1.31 |
| Example 4 | 1.31 |

TABLE 1-continued

| | Layer density (dyne/cm$^2$) |
|---|---|
| Comparative Example 1 | 1.29 |
| Comparative Example 2 | 1.29 |
| Comparative Example 3 | 1.28 |

Referring to Table 1, it may be that the resist underlayer formed from the compositions of Examples 1 to 4 exhibited excellent layer density, compared with Comparative Examples 1 to 3.

Evaluation 2: Evaluation of Coating Uniformity

Each resist underlayer obtained from Evaluation 1 was measured for a 51 point thickness in the horizontal axis, and the coating uniformity thereof was compared. The thickness was measured by Opti-2600 (manufactured by Thermawave) employing ellipsometry, and the results are shown in Table 2.

In Table 2, smaller coating uniformities (%) are better.

TABLE 2

| | Coating uniformity (%) |
|---|---|
| Example 1 | 0.7 |
| Example 2 | 0.7 |
| Example 3 | 0.8 |
| Example 4 | 0.7 |
| Comparative Example 1 | 0.8 |
| Comparative Example 2 | 0.9 |
| Comparative Example 3 | 1.1 |

Referring to Table 2, it may be that resist underlayer compositions of Examples 1 to 4 had more excellent coating uniformity than the resist underlayer compositions of Comparative Examples 1 to 3.

Evaluation 3: Evaluation of Storage Stability

Resist underlayer compositions of Examples 1 to 4 and Comparative Examples 1 to 3 were stored at 40° C. for 1 month, and the morphology and the precipitation degree were each monitored by a gel transmission chromatography to compare the storage stability, and the results are shown in Table 3.

In Table 3, the storage stability is better as there is no graph change in the gel permeation chromatography and no precipitation.

TABLE 3

| | Graph change in gel permeation chromatography | Precipitation |
|---|---|---|
| Example 1 | X | not generated |
| Example 2 | X | not generated |
| Example 3 | X | not generated |
| Example 4 | X | not generated |
| Comparative Example 1 | ◯ | not generated |
| Comparative Example 2 | ◯ | generated |
| Comparative Example 3 | ◯ | generated |

Referring to Table 3, the resist underlayer compositions according to Examples 1 to 4 exhibited excellent storage stability, compared with the resist underlayer compositions according to Comparative Examples 1 to 3.

By way of summation and review, as technology for manufacturing an ultra-fine pattern, an activated radiation having a short wavelength such as an i-line (365 nm), a KrF excimer laser (wavelength of 248 nm), an ArF excimer laser (wavelength of 193 nm), and the like may be used for exposure of a photoresist. The activated radiation may cause a diffused reflection from a semiconductor substrate, a standing wave, or the like. A resist underlayer having optimal reflectance may be included between the photoresist and the semiconductor substrate.

A high energy ray such as EUV (extreme ultraviolet; a wavelength of 13.5 nm), an E-beam (electron beam), and the like as a light source for manufacturing the fine pattern in addition to the activated radiation may be used, and the light source has no reflection from the substrate. Adherence of the resist to the lower layer may be improved to improve a collapse of the pattern. In addition, etch selectivity and chemical resistance of the resist underlayer may be improved, and issues caused by the light source may be considered.

One or more embodiments may provide a photoresist underlayer composition formed between a semiconductor substrate and a photoresist layer, and a method of forming photoresist patterns using the undercoat layer.

One or more embodiments may provide a resist underlayer composition having optimal reflectance in a predetermined wavelength and simultaneously, improved coating properties, storage stability, and chemical resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming patterns, the method comprising:
forming an etching subject layer on a substrate,
coating a resist underlayer composition on the etching subject layer to form a resist underlayer,
forming a photoresist pattern on the resist underlayer, and
sequentially etching the resist underlayer and the etching subject layer using the photoresist pattern as an etching mask,
wherein the resist underlayer composition includes:
a polymer including at least one of a first moiety represented by Chemical Formula 1-1 and a second moiety represented by Chemical Formula 1-2;
a thermal acid generator including a salt composed of an anion of an acid and a cation of a base, the base having a pKa of greater than or equal to about 7; and
a solvent,

[Chemical Formula 1-1]

[Chemical Formula 1-2]

wherein, in Chemical Formula 1-1 and Chemical Formula 1-2, a and f are each independently an integer of 0 to 3, when a is 0, $R^1$ is hydrogen, a C1 to C30 alkyl group substituted with at least one hydroxy group, or a C1 to C30 heteroalkyl group substituted with at least one hydroxy group, when a is an integer of 1 to 3, $R^1$ is a hydroxy group and $R^0$ is a substituted or unsubstituted C1 to C30 alkylene group, a substituted or unsubstituted C6 to C30 arylene group, a substituted or unsubstituted C1 to C30 heteroalkylene group, a substituted or unsubstituted C1 to C30 heteroalkenylene group, a substituted or unsubstituted C2 to C30 heteroarylene group, a substituted or unsubstituted C2 to C30 alkenylene group, a substituted or unsubstituted C2 to C30 alkynylene group, —(C=O)—O—, —O—, —S—, or a combination thereof, $R^2$ to $R^6$ are each independently a substituted or unsubstituted C1 to C30 alkylene group, a substituted or unsubstituted C6 to C30 arylene group, a substituted or unsubstituted C1 to C30 heteroalkylene group, a substituted or unsubstituted C1 to C30 heteroalkenylene group, a substituted or unsubstituted C2 to C30 heteroarylene group, a substituted or unsubstituted C2 to C30 alkenylene group, a substituted or unsubstituted C2 to C30 alkynylene group, —(C=O)—O—, —O—, —S—, or a combination thereof, provided that $R^4$ to $R^6$ do not comprise —O—, and at least one of $R^4$ to $R^6$ comprises —S—, b and c are each independently an integer of 0 to 3, d and e are each independently an integer of 1 to 3, and

* is a linking point.

2. The method according to claim 1, wherein the anion of the thermal acid generator is a non-aromatic anion.

3. The method according to claim 1, wherein the anion of the thermal acid generator is represented by Chemical Formula 2:

[Chemical Formula 2]

wherein, in Chemical Formula 2,

$R^{11}$ to $R^{15}$ are each independently hydrogen, deuterium, a halogen, a substituted or unsubstituted C1 to C30 alkyl group, or a substituted or unsubstituted C1 to C30 heteroalkyl group, provided at least one of $R^{11}$ to $R^{13}$ is a halogen, and n is an integer of 0 to 10.

4. The method according to claim 3, wherein in Chemical Formula 2, at least one of $R^{11}$ to $R^{15}$ is fluorine.

5. The method according claim 1, wherein the cation of the thermal acid generator is represented by Chemical Formula 3:

[Chemical Formula 3]

wherein, in Chemical Formula 3, $R^{21}$ to $R^{24}$ are each independently hydrogen, deuterium, a substituted or unsubstituted C1 to C30 alkyl group, or a substituted or unsubstituted C1 to C30 heteroalkyl group.

6. The method according to claim 1, wherein the thermal acid generator is included in an amount of about 0.01 wt % to about 10 wt %, based on a total weight of the resist underlayer composition.

7. The method according to claim 1, wherein:

the polymer includes the first moiety represented by Chemical Formula 1-1, and in Chemical Formula 1-1, $R^2$ and $R^3$ are each independently —(C=O)—O—, —O—, —S—, a substituted or unsubstituted C1 to C30 alkylene group, or a substituted or unsubstituted C1 to C30 heteroalkylene group.

8. The method according to claim 1, wherein:

the polymer includes the first moiety represented by Chemical Formula 1-1, and in Chemical Formula 1-1, a is 1, and $R^0$ is —(C=O)—O—, —O—, —S—, a substituted or unsubstituted C1 to C30 alkylene group, or a substituted or unsubstituted C1 to C30 heteroalkylene group.

9. The method according to claim 1, wherein the polymer has a weight average molecular weight of about 1,000 g/mol to about 100,000 g/mol.

10. The method according to claim 1, wherein the polymer is included in an amount of about 0.1 wt % to about 40 wt %, based on a total weight of the resist underlayer composition.

11. The method according to claim 1, wherein the resist underlayer composition further includes a cross-linking agent having two or more cross-linking sites.

12. The method according to claim 1, wherein the resist underlayer composition further includes a surfactant, an absorber, a plasticizer, or a combination thereof.

13. The method according to claimed in claim 1, wherein forming the photoresist pattern includes:

forming a photoresist layer on the resist underlayer, exposing the photoresist layer to a light, and developing the photoresist layer.

14. The method according to claimed in claim 13, wherein forming the photoresist pattern further includes:

a primary baking at about 90° C. to about 120° C. before the exposing the photoresist layer to a light, and a secondary baking at about 90° C. to about 150° C. after the exposing the photoresist layer to a light.

15. The method according to claimed in claim 1, wherein forming the resist underlayer further includes heat-treating the coated resist underlayer composition at a temperature of about 100° C. to about 500° C.

* * * * *